US005382168A

United States Patent [19]

Azuma et al.

[11] Patent Number: 5,382,168

[45] Date of Patent: Jan. 17, 1995

[54] STACKING CONNECTOR ASSEMBLY OF VARIABLE SIZE

[75] Inventors: Youichiro Azuma; Shigeyasu Kitamura, both of Tokyo, Japan

[73] Assignee: KEL Corporation, Tokyo, Japan

[21] Appl. No.: 158,629

[22] Filed: Nov. 29, 1993

[30] Foreign Application Priority Data

Nov. 30, 1992 [JP] Japan ................................ 4-343211

[51] Int. Cl.6 ................................................ H05K 1/00

[52] U.S. Cl. ...................................... 439/65; 439/590

[58] Field of Search ............... 439/381, 380, 442, 569, 439/570, 571, 686, 695, 701, 65, 540, 590, 375, 379

[56] References Cited

U.S. PATENT DOCUMENTS 3,376,543 4/1968 Hammell ...................... 439/540 OR
4,028,794 6/1977 Ritchie et al. .................... 439/65 X
4,230,387 10/1980 Zahn ........................... 439/590 OR
4,703,394 10/1987 Petit et al. ........................ 439/65 X
4,984,132 1/1991 Sakurai et al. .................... 439/65 X

FOREIGN PATENT DOCUMENTS 3176976 7/1991 Japan .

*Primary Examiner*—David L. Pirlot
*Assistant Examiner*—Daniel Wittels
*Attorney, Agent, or Firm*—Robert W. J. Usher

[57] ABSTRACT

A stacking connector assembly of adjustable height comprises a matable connector member mounted on a circuit board engaging positioning plate by a pair of spacing arms which are integrally formed in one piece with either the positioning plate or the matable connector member and are severable to selected lengths. Lead forming posts extend from a rear face of the connector member, away from a mating face, and the positioning plate is formed with a series of post receiving through-apertures, predetermined of which are of smaller cross-section than the posts to receive posts as a force fit.

14 Claims, 9 Drawing Sheets

Fig. 4
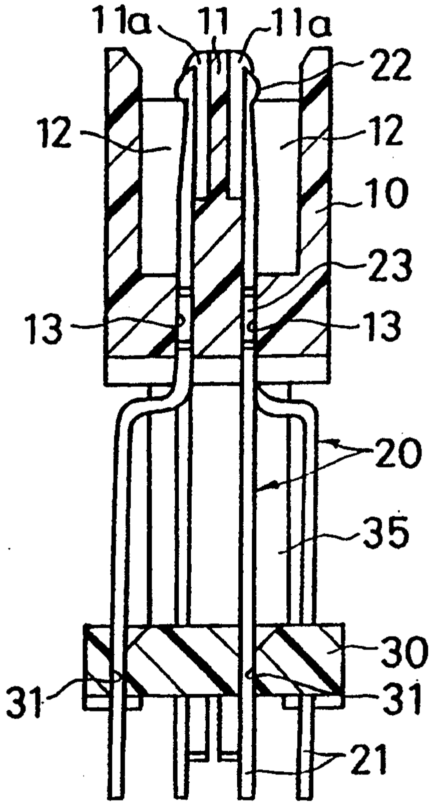
Fig. 5 (a)
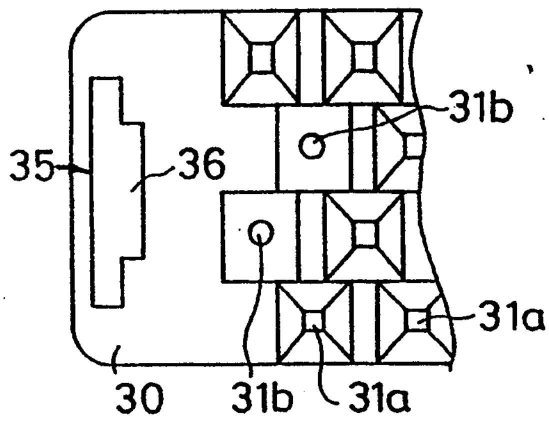
Fig. 5 (b)
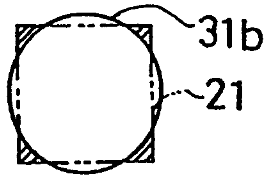
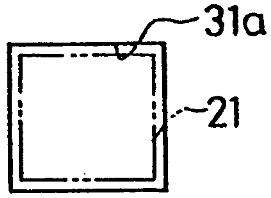
Fig. 5 (c)

(A)

(B)

STACKING CONNECTOR ASSEMBLY OF VARIABLE SIZE

FIELD OF THE INVENTION

The invention relates to a connector assembly of variable size and particularly to such connector assembly of the stacking type.

BACKGROUND OF THE INVENTION

The use of connectors of the stacking type to interconnect circuit boards in parallel relation is well known. As exemplified in FIG. 11, such connectors comprise mated male and female connectors 201 and 211, respectively, mounted on faces of first and second circuit boards 200 and 210, respectively, thereby stacking and electrically connecting the circuit boards together. The heights of electronic parts 205 and 215 mounted on the opposed faces of the boards differ and the requisite gap between the boards 200 and 210 (stack height H) must accommodate such height variations. Clearly such gap may be maximized to accommodate the heights of all possible parts but the space taken up by the stacked circuit boards to attach the boards may then frequently be unnecessarily large, which is unacceptable with the inexorable requirement for compactness of electronic parts. Prior approaches have therefore taught that the heights h1 and h2 of the connectors should differ according to the maximum heights of the electronic parts on the respective circuit boards on which the connectors are mounted enabling the gap to be maintained as small as feasible so that the resulting board assembly was compact.

However, such approach necessitated the manufacture of many kinds of connectors with the same number of and shapes of contacts, differing only in the heights of their insulating housings, increasing both manufacturing, particularly tooling, costs and those costs associated with inventory storage and control which became increasing complex.

In order to ameliorate the problem, prior connectors were made as two separate types of parts: connecting (mating) members, which were mated with complementary connectors, and spacing members which were the only, parts produced as a plurality of different structures and selected according to the required heights. Thus, although only mating members of only a single height were required regardless of the heights of the electronic parts, it was still necessary to manufacture many kinds of spacing parts, and the problems of high manufacturing cost and complexity of management remained.

SUMMARY OF THE INVENTION

An object of the invention is to provide a connector assembly which will eliminate the requirement to manufacture and maintain an inventory of spacing members of different sizes.

According to one aspect of the invention, there is provided an electrical connector assembly of variable size comprising: a connector member for mating with a complementary connector member and comprising a housing of insulating material having a mating face; a series of electrical contacts each having a mating portion and an elongate lead portion extending longitudinally therefrom, the contacts being anchored in the housing to extend therethrough with the mating portions at the mating face and the lead portions extending away from the mating face; a positioning plate of insulating material formed with a series of lead receiving apertures extending therethrough; and a pair of spacing arms each attached at one of their respective ends to one of the housing and positioning plate at spaced apart locations thereof and having free ends severable to selected lengths; mounting means at spaced apart locations of one of the positioning plate and housing and cooperable with respective free ends after severing for mounting the respective spacer arms extending between the positioning plate and housing thereby maintaining them spaced apart by a distance determined by the lengths selected.

In a preferred embodiment, the spacing arms are integrally formed with one of the housing and positioning plate as a single piece at respective opposite ends thereof and the mounting means comprises recesses at respective opposite ends of one of the positioning plate and housing which receive free ends of respective arms.

Thus, it is only necessary to sever the spacing arms to a selected size when the heights of the circuit board mounted parts are known to provided a minimum acceptable clearance and stack height, obviating the requirement for the manufacture and control of an inventory of spacing parts of different heights. Only two different molded parts are therefore required to form the connector assemblies.

BRIEF DESCRIPTION OF THE DRAWINGS

Specific embodiments of stacking connector assemblies according to the invention will now be described by example only, with reference to accompanying drawings in which:

FIG. 4 is a cross-sectional view taken along the line 4—4 of FIG. 1;

FIG. 5(*a*) is a fragmentary plan view of one end portion of the positioning member;

FIGS. 5(*b*) and 5(*c*) are schematic plan views of lead receiving apertures of circular and square cross-section, respectively, formed in a positioning plate of the positioning member;

DESCRIPTION OF PARTICULAR EMBODIMENTS

Figure 1:
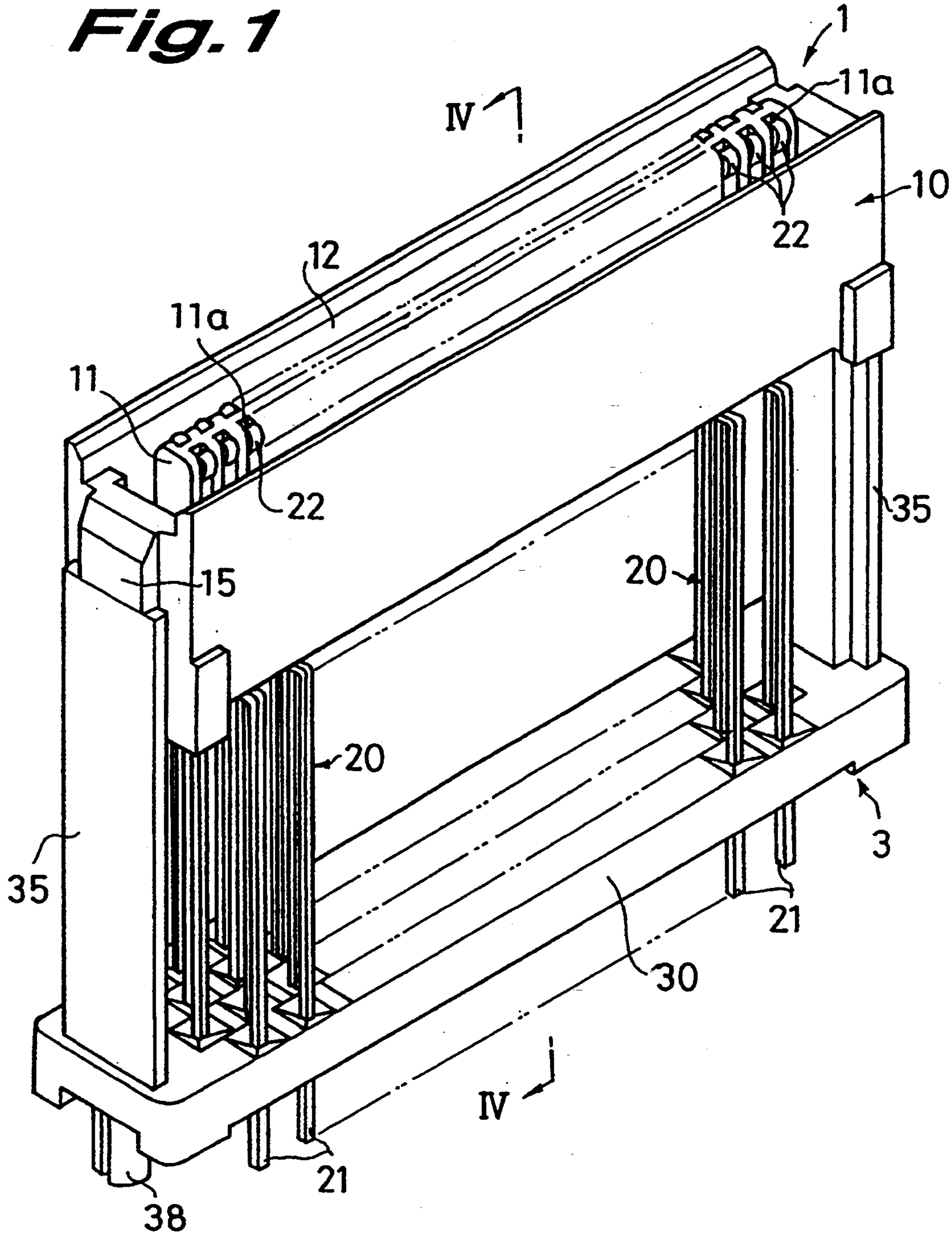
FIG. 1 is a schematic perspective view of a first embodiment of connector assembly according to the invention.
Figure 2:
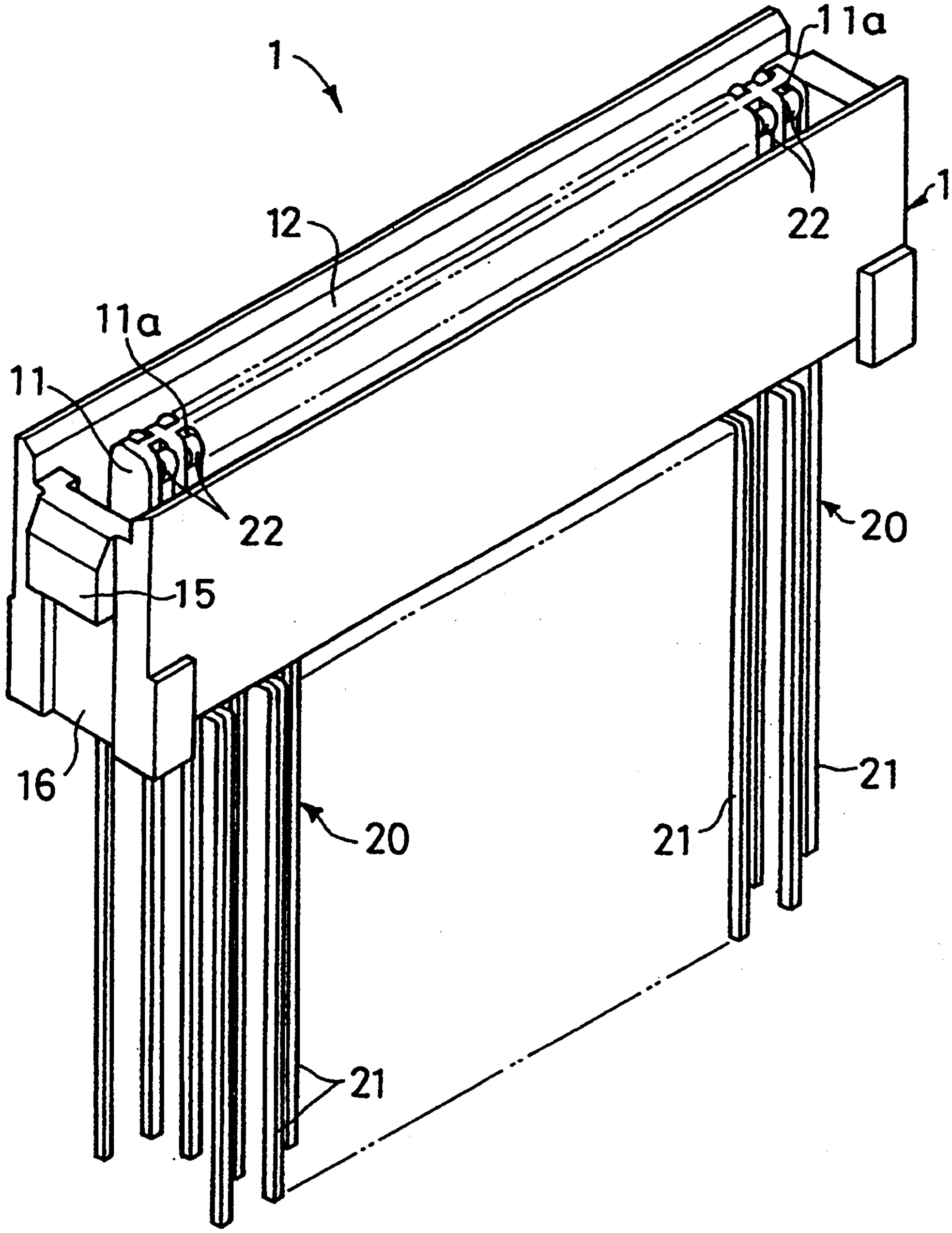
FIG. 2 is a schematic perspective view of a connector member of the connector assembly shown in FIG. 1.

As shown particularly in FIGS. 1–6, an electrical connector assembly of the stacking type comprises a connector member 1 and a positioning member 3. The connector member 1 comprises an elongate housing 10 molded in one piece of plastic material and having an upper or front mating face formed into a generally channel-section with an elongate rib 11 upstanding centrally from the channel base defining mating grooves 12 on respective opposite sides thereof and formed with rows of contact receiving cavities, formed as grooves 11*a*, on respective opposite sides of the rib, extending downward from the mating face, and communicating with anchoring bores 13 extending through the channel base.

Mounting means are provided at respective opposite ends of the housing and comprises stops 15 forming blind upper ends, terminating downward opening vertical mounting grooves 16. Opposite side walls of the grooves are, optionally, formed at predetermined intervals with inwardly extending locking pimples 16*a*.

A series of electrical contacts 20 are stamped and formed from sheet metal stock and comprise central anchoring portions 23 of enlarged cross-section from respective opposite ends of which extend resilient mating portions 22 and lead forming posts 20 of rectangular cross-section. The contacts are anchored to extend through the housing in two rows by the central portions 23 being force fitted in the respective bores 13 so that the mating portions extend upwards along the grooves to the upper end of the mating face and the posts extend downward from a lower, rear face. Alternate posts of each row are straight and bent or stepped outwardly, respectively, with a straight portion on one side of the rib being aligned with an outwardly stepped portion on the other side of the rib, as best seen in FIG. 4, the resulting stagger forming four rows of posts and increasing the separation of adjacent posts.

Figure 6:
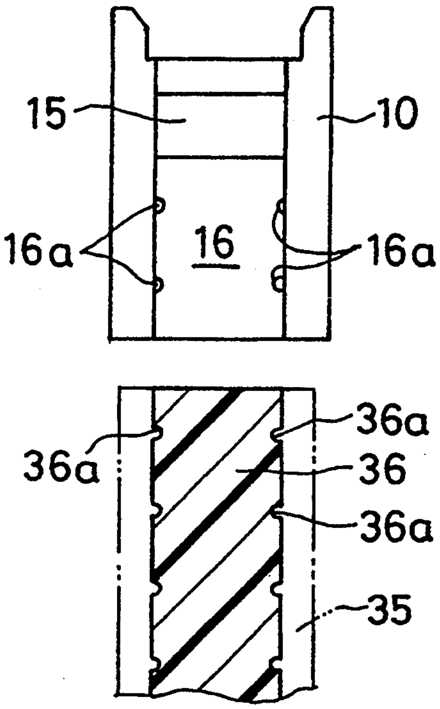
FIG. 6 is an end elevation of a housing of the positioning member with a portion of a spacing arm partly cut away and shown aligned for mounting thereon aligned therewith.

The positioning member 3 is also molded in one piece of insulating plastic material and comprises an elongate positioning plate portion 30 having a series of post-receiving apertures formed therethrough, between front, upper post receiving and rear, lower board engaging faces thereof, and arranged in four rows at a pitch corresponding to that of the posts. As shown in FIGS. 5 (*a*)–(*c*), endmost apertures 31*b* of the two central rows at each opposite end of the plate portion have a circular transverse cross-section of less diameter than the diagonal lengths of the posts, receiving the posts therein as a force or interference sliding fit, while the remaining apertures 31*a* are of sufficiently large, rectangular cross-section to receive the remaining posts as free sliding fits. Spacing arms 35 are integrally molded with the positioning plate portion 30 to upstanding from the front, upper face, adjacent respective opposite ends thereof. The posts are of constant transverse cross-section along their lengths and have locating lands 36 extending centrally along their lengths, protruding inwardly towards each other. As shown in FIG. 6, optional hemispherical locking recesses 36*a* are formed at intervals which correspond to those of the pimples 16*a* formed along opposite outer edge portions thereof. Split cylindrical mounting posts 38 depend from the lower face of the plate portion adjacent respective opposite ends for anchoring receipt in apertures in a circuit board (not shown).

The connector of FIGS. 1–5 is preassembled as shown in FIG. 1, by engaging locating lands 36 of respective spacing arms 35 within respective grooves 16, with upper tips of the spacing arms arrested by the stops 15 and the posts received as interference fits in the apertures 31*b*, thereby mounting the housing on the free ends of the posts. When required, retention of the locating lands in the grooves is ensured by receipt of the optional pimples 16*a* in the recesses 36*a*. However, prior to assembly with a circuit board, free ends of the spacing arms are severed as required to locate the mating face with an acceptably minimum clearance above other board mounted devices. As the spacing arms are of constant cross-section they fit into, and are held in, the grooves irrespective of the lengths to which they are severed.

Figure 7:
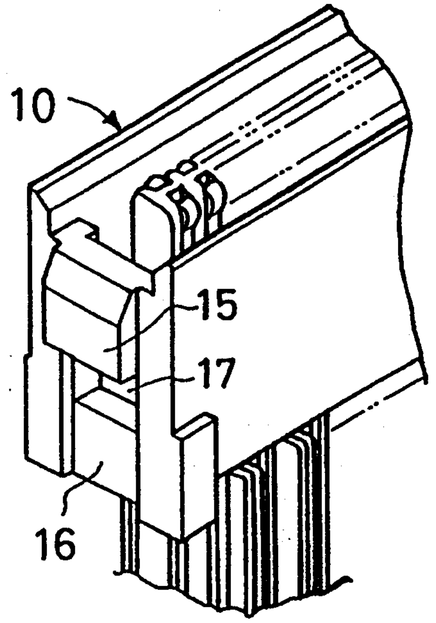
FIGS. 7(*a*) and 7(*b*), respectively, are fragmentary perspective views of modified connecting and positioning members.
Figure 7:
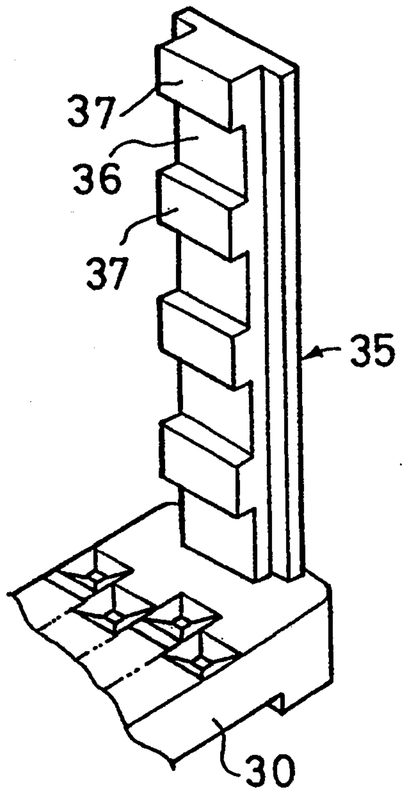

In the modification shown in FIG. 7, locking recesses 17 are formed in the grooves 16 and a series of locking projections 32 are formed at predetermined intervals along lands 36 for receipt in respective recesses to attach the spacing arms and the housing securely together.

Figure 3:
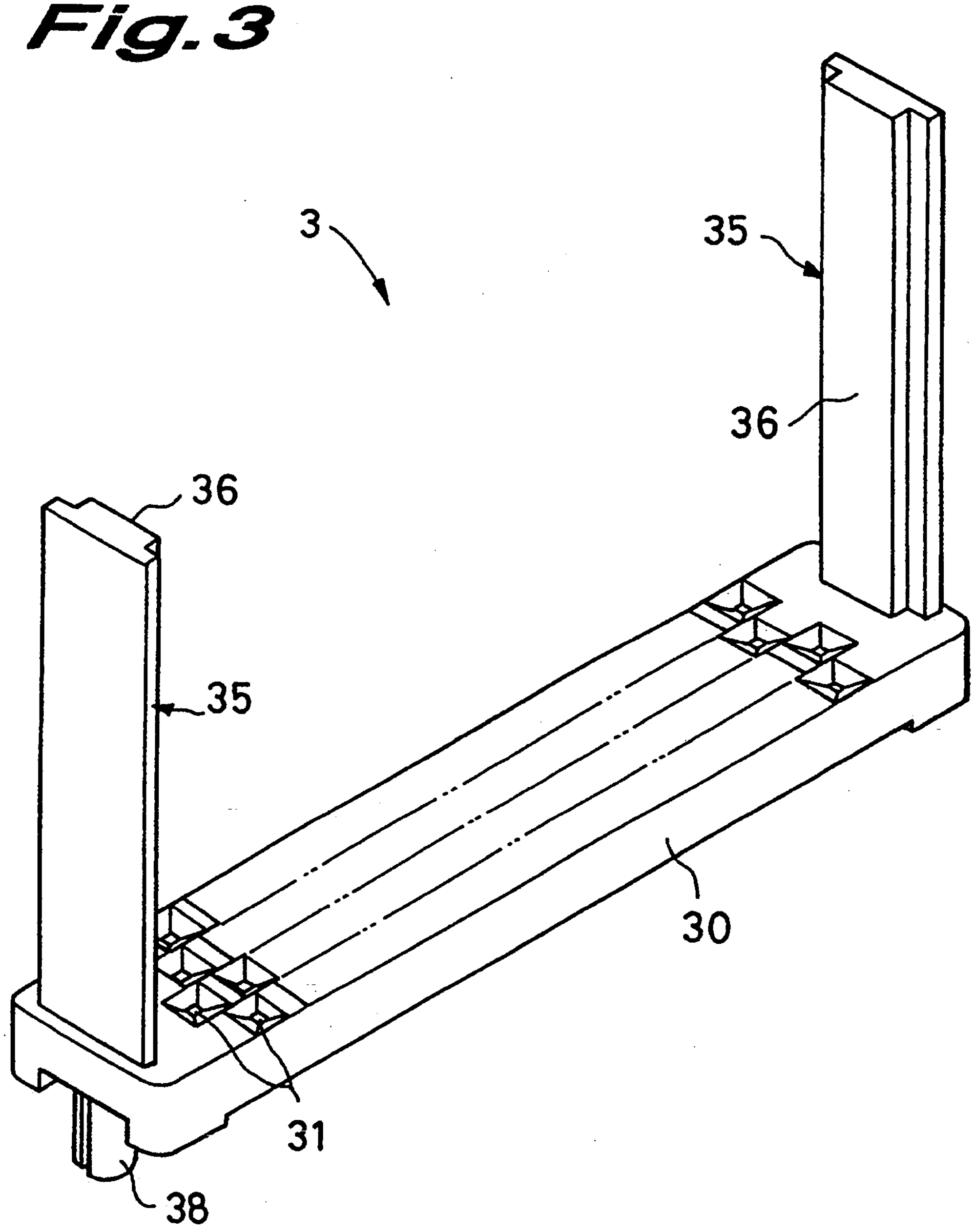
FIG. 3 is a schematic perspective view of a positioning member of the connector assembly shown in FIG. 1.
Figure 8:
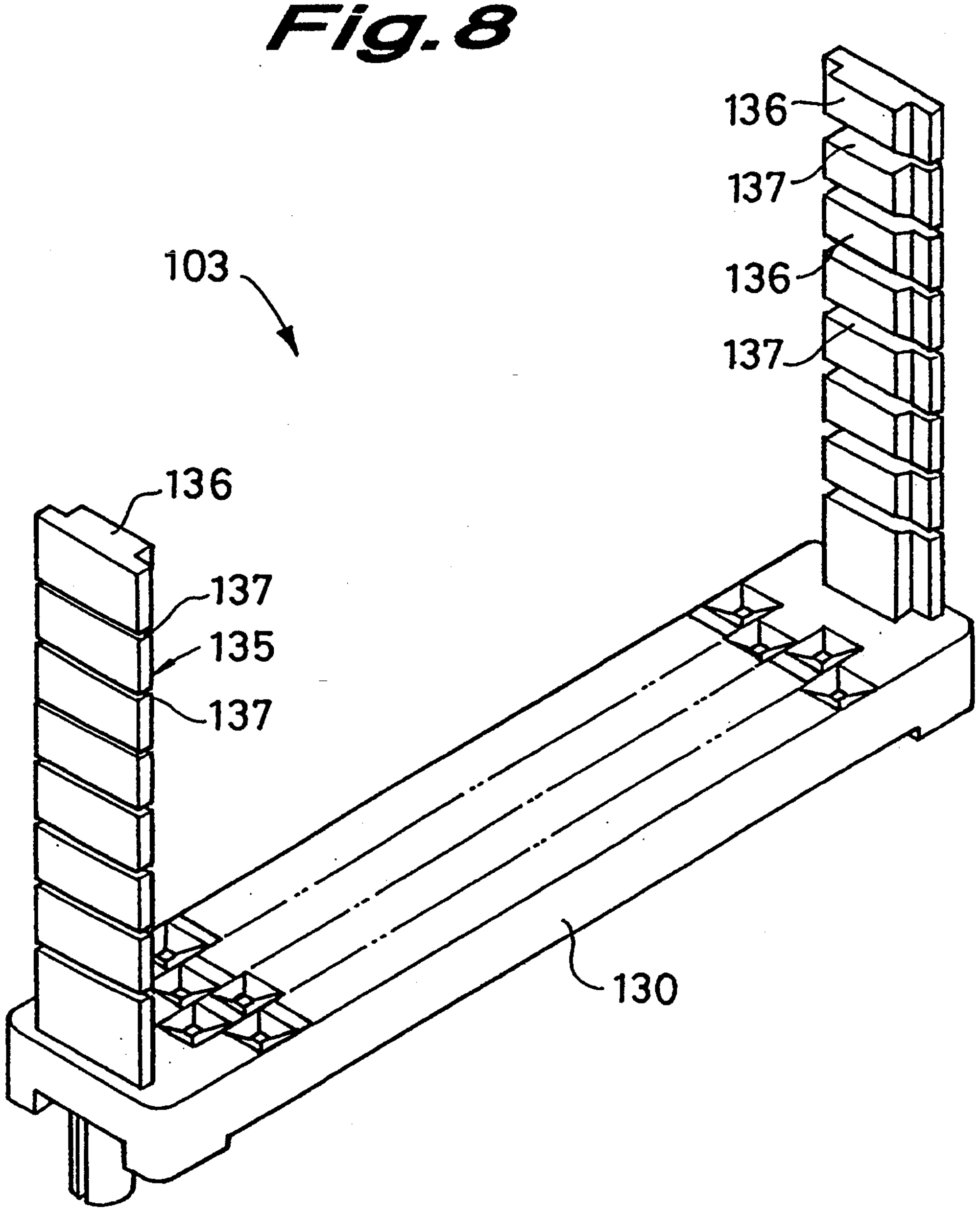
FIG. 8 is a schematic perspective view of another modified positioning member.

In the modification shown in FIG. 8, the plate portion 130 is similar to that of FIG. 3, while the spacing arms 135 are formed with encircling slits 137 at predetermined vertical intervals, (e.g. 1 mm) at which the spacing arms can be easily cut to permit relatively precise height and therefore clearance adjustment.

Figure 9:
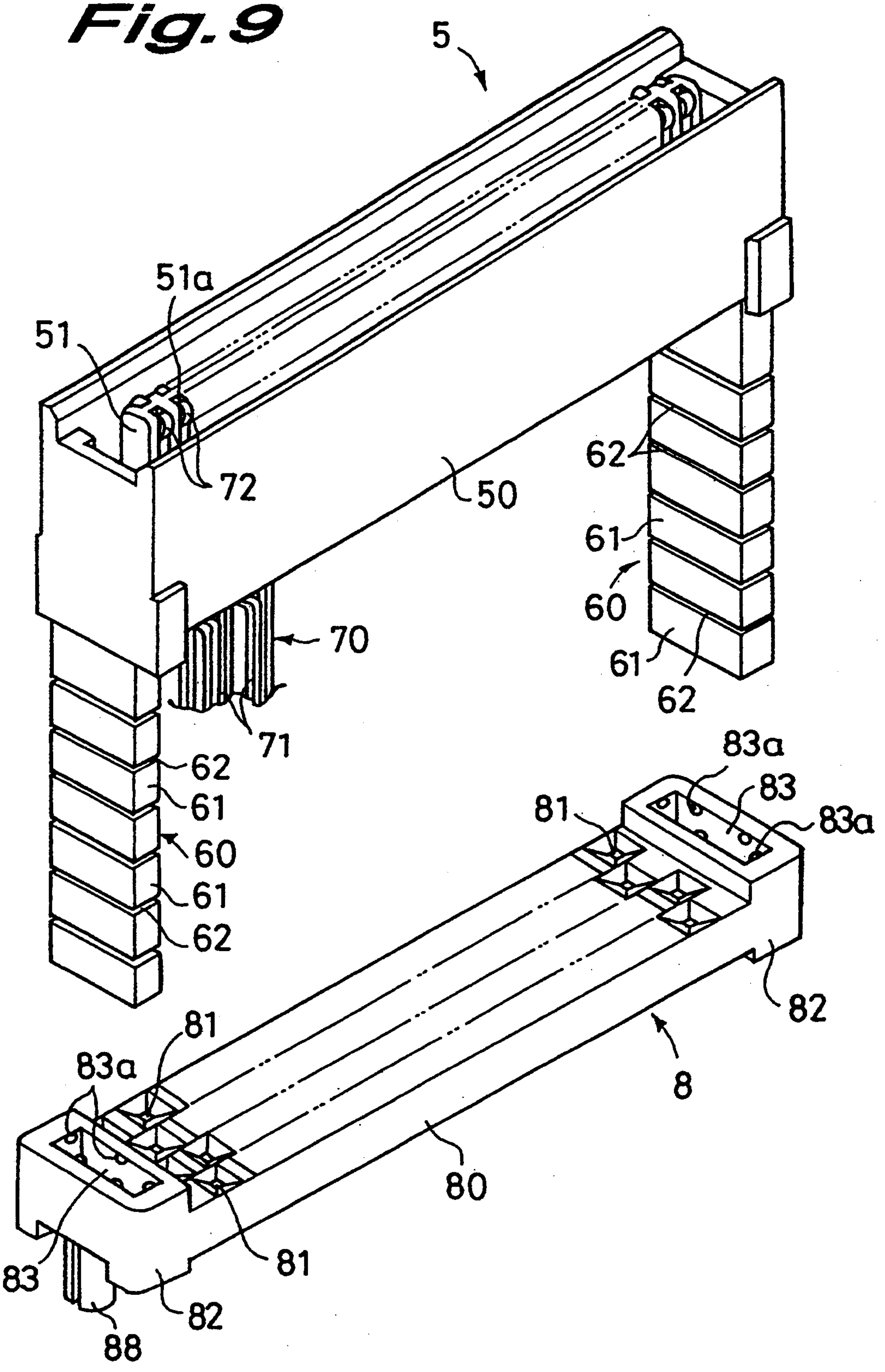
FIG. 9 is a schematic perspective view, partly broken away, of a connecting member and a positioning member of a connector according to another embodiment of the invention aligned for assembly together.
Figure 11:
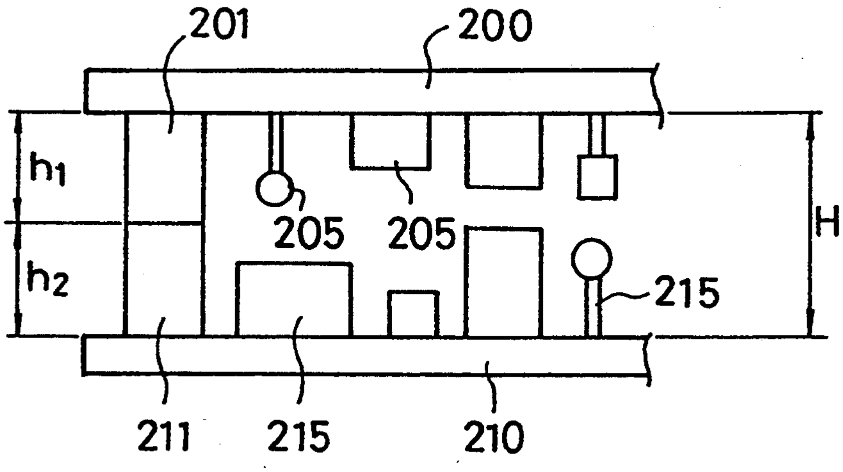
FIG. 11 is a diagrammatic elevational view showing circuit boards connected together in stacked relation by a stacking connector of the type of the invention.

In the embodiment shown in FIG. 9, the connector assembly comprises a connector member 5 and a positioning member 8. The connector member 5 is of generally similar construction to that of the first embodiment having a one-piece, molded insulating housing 50 retaining contacts 70 of identical structure to those of the first embodiment with posts 71 depending from a lower face and mating portions 72 located in grooves 51*a* formed on respective opposite sides of a central rib 51 at a mating face. However, spacing arms 60, are integrally formed depending from respective opposite ends of the housing. The spacing arms 60 are formed with encircling slits 62 at predetermined vertical intervals, (e.g. 1 mm) at which the spacing arms can be easily cut to remove small pieces 61 permitting relatively precise height and therefore clearance adjustment.

The positioning member 8 comprises a positioning plate portion 80 formed as a one-piece molding with post receiving through apertures 81 similarly located to those of above examples. Arm receiving lands 82 are formed at respective opposite ends of the plate portion and are formed with arm receiving sockets 83 of predetermined depth, below which, split cylindrical mounting posts depend. Inwardly protruding holding or locking pimples 83*a* are formed in walls of the sockets.

Assembly is effected by inserting the free ends of the spacing arms, severed, if necessary, to reduce the overall height of the assembly, into the sockets with the posts 71 inserted through respective apertures 81.

In a modification, instead of being part of the plate 80, the sockets may be integrally formed with the housing member and the spacing arms may be integrally formed with the plate portion to upstand therefrom, instead of being part of the housing 80.

Figure 10:
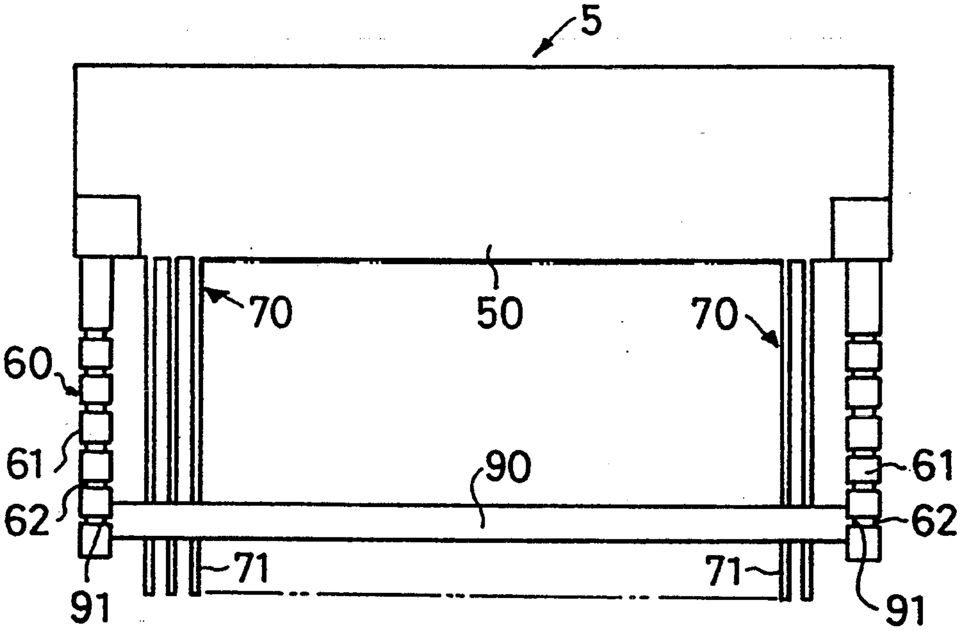
FIG. 10 is a diagrammatic side elevation of a connector assembly similar to that of FIG. 9 but with a modified positioning plate portion.

The connector can also be made by forming the positioning plate portion as shown in FIG. 10, in which the connector member 5 is identical to that of FIG. 9, and only the shape of the positioning plate portion 90 differs from that of FIG. 9. The positioning plate portion 90 is flat and formed with a series of post receiving through apertures. Tab-like projections 91 are formed at both ends to protrude outwardly for receipt in the slits 62 in the spacing arms, thereby to attach the positioning plate part 90 to the connector member 5.

Therefore, connectors of any desired height can be easily made simply by preparing only one kind of part; the manufacturing cost can be reduced, and parts management can be simplified.

We claim:

1. An electrical connector assembly of variable size comprising:

a connector member for mating with a complementary connector member and comprising a housing of insulating material having a mating face; a series of electrical contacts each having a mating portion and an elongate lead portion extending longitudinally therefrom, the contacts being anchored in the housing to extend therethrough with the mating portions at the mating face and the lead portions extending away from the mating face;

a positioning plate of insulating material formed with a series of lead receiving apertures extending therethrough; and a pair of spacing arms each attached at one of their respective ends to one of the housing and positioning plate at spaced apart locations thereof and having free ends severable to selected lengths;

mounting means at spaced apart locations of one of the positioning plate and housing and cooperable with respective free ends after severing for mounting the respective spacer arms extending between the positioning plate and housing thereby maintaining them spaced apart by a distance determined by the lengths selected.

2. An electrical connector assembly according to claim 1 in which the lead portions are severable to selected lengths.

3. An electrical connector assembly according to claim 1 in which the spacing arms are integrally formed with the positioning plate as a single piece at respective opposite ends thereof and the mounting means comprises recesses at respective opposite ends of the housing which receive free ends of respective arms.

4. An electrical connector assembly according to claim 1 in which the spacing arms are integrally formed with the housing as a single piece at respective opposite ends thereof and the mounting means comprises recesses at respective opposite ends of the spacing plate which receive free ends of respective arms.

5. An electrical connector assembly according to claim 1 in the leads comprise posts stamped and formed from sheet metal stock and selected of the lead receiving apertures located adjacent respective opposite ends of the positioning plate have a smaller transverse cross-section than a corresponding cross-section of the posts for receiving posts therein in an interference sliding fit and other of the lead receiving apertures receiving other posts in a sliding fit.

6. An electrical connector assembly according to claim 1 in which respective spacing arms each have at least one line of weakness formed at predetermined intervals therealong on which lines the spacing arms can be severed to the selected lengths.

7. An electrical connector assembly according to claim 6 in which said at least one line of weakness is constituted by a groove encircling a respective spacing arm.

8. An electrical connector assembly according to claim 3 in which said mounting means comprise recesses formed in the connector member and spacing arm engaging projections are formed in walls of said recesses.

9. An electrical connector assembly according to claim 3 in which said mounting means comprise recesses formed in the positioning plate and spacing arm engaging projections are formed in walls of said recesses.

10. An electrical connector assembly according to claim 1 in which means are provided on the positioning plate for anchoring a rear face of the positioning plate on a face of a circuit board with the lead portions of the contacts electrically connected to selected conductive paths of the circuit board and with the mating face located for mating with a complementary connector assembly which is similarly anchored on a circuit board thereby electrically connecting the circuit boards.

11. An electrical connector assembly according to claim 3 in which locating lands which are sized to fit in respective recesses extend along central locations of respective spacing arms.

12. An electrical connector assembly according to claim 4 in which locating lands which are sized to fit in respective recesses extend along central locations of respective spacing arms.

13. A stacking connector assembly for mating with a complementary stacking connector assembly to connect two circuit boards together in space apart, parallel, face-to-face relation comprising:

a connector member comprising an elongate housing molded in one piece from insulating plastic material having a front, mating face and a rear face, opposite the mating face, and mounting means at respective opposite longitudinal ends; a series of electrical contacts each having a mating portion and an elongate lead portion extending longitudinally therefrom, the contacts being anchored in the housing to extend therethrough between front and rear faces with the mating portions at the mating face and the lead portions extending from the rear face away from the mating face;

a positioning member comprising an elongate positioning plate molded in one piece from insulating plastic material and having front and rear faces and formed with a series of lead receiving apertures extending therethrough between the front and rear faces; and a pair of spacing arms integrally formed with respective opposite longitudinal ends of the positioning plate to outstand generally perpendicularly from the front face, the spacing arms being severable at respective free ends thereof to selected lengths and cooperable, after severing, with respective mounting means to mount the connecting member on the positioning member with the spacing arms extending between them, thereby to maintain the housing and the positioning plate spaced apart by a distance determined by the lengths selected.

14. A stacking connector assembly for mating with a complementary stacking connector assembly to connect two circuit boards together in space apart, parallel, face-to-face relation comprising:

a connector member comprising an elongate housing molded in one piece from insulating plastic material having a front, mating face and a rear face, opposite the mating face, and a pair of spacing arms integrally formed with respective opposite longitudinal ends of the housing to outstand generally perpendicularly from the rear face; a series of electrical contacts each having a mating portion and an elongate lead portion extending longitudinally therefrom, the contacts being anchored in the housing to extend therethrough between front and rear faces with the mating portions at the mating face and the lead portions extending from the rear face away from the mating face;

a positioning member comprising an elongate positioning plate molded in one piece from insulating plastic material and having front and rear faces and formed with a series of lead receiving apertures extending therethrough between the front and rear faces; and mounting means at respective opposite longitudinal ends;

the spacing arms being severable at respective free ends thereof to selected lengths and cooperable, after severing, with respective mounting means to mount the connecting member on the positioning member with the spacing arms extending between them, thereby to maintain the housing and the positioning plate spaced apart by a distance determined by the lengths selected.

* * * * *